(12) United States Patent
Park et al.

(10) Patent No.: US 7,287,891 B1
(45) Date of Patent: Oct. 30, 2007

(54) BACKLIGHT ASSEMBLY AND DISPLAY DEVICE HAVING THE SAME

(75) Inventors: Se-Ki Park, Suwon-si (KR);
Seok-Hyun Nam, Seoul (KR);
Byung-Choon Yang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/627,680

(22) Filed: Jan. 26, 2007

(30) Foreign Application Priority Data

Feb. 6, 2006 (KR) .................... 10-2006-0011058

(51) Int. Cl.
*F21V 8/00* (2006.01)
(52) U.S. Cl. .................... 362/555; 362/561; 362/612; 362/613
(58) Field of Classification Search ................ 362/235, 362/236, 237, 240, 241, 246, 800, 555, 561, 362/602, 612, 613, 614, 615
See application file for complete search history.

(56) References Cited

U.S. PATENT DOCUMENTS 4,714,983 A * 12/1987 Lang ........................ 362/27
6,964,497 B2 * 11/2005 Greiner ...................... 362/241
2005/0174802 A1 * 8/2005 Wu et al. .................... 362/602

FOREIGN PATENT DOCUMENTS

| JP | 10-082915 | 3/1998 |
|---|---|---|
| JP | 2003-008081 | 1/2003 |
| JP | 2004-349251 | 12/2004 |

* cited by examiner

*Primary Examiner*—Laura Tso
(74) *Attorney, Agent, or Firm*—F. Chau & Assoc., LLC

(57) ABSTRACT

A backlight assembly includes a light source unit a light guiding plate and an optical changing pattern. The tight source unit includes a light source, a first lens portion enclosing the light source and a second lens portion positioned on the first lens portion. The second lens portion has a concave shape at an upper face. The light guiding plate includes an upper face and a lower face. The light guiding plate has a groove formed on the lower face to enclose at least a portion of the light source unit. The light guiding plate guides the light generated from the light source unit. The optical path changing pattern is formed on the upper face of the light guiding plate, and faces the light source unit. As a result, an optical distribution of the backlight assembly may be uniformized, and a size of the backlight assembly may be reduced.

13 Claims, 10 Drawing Sheets

BACKLIGHT ASSEMBLY AND DISPLAY DEVICE HAVING THE SAME

CROSS-REFERENCE TO RELATED APPLICATIONS

This application claims priority to Korean Patent Application No. 2006-11058 filed on Feb. 6, 2006, the contents of which are herein incorporated by reference in their entireties.

BACKGROUND OF THE INVENTION

1. Technical Field

The present invention relates to a backlight assembly and, more particularly, to a backlight assembly capable of improving optical characteristics and a display device having the backlight assembly.

2. Discussion of the Related Art

A display device can convert electrical format data from an information processing unit into a visible image to display the image. Examples of the display device include a cathode ray tube (CRT) type display device, a plasma display panel (PDP) device, a liquid crystal display (LCOD) device, and an electroluminescence (EL) display device.

The LCD device, a type of flat panel display device, displays an image using electrical characteristics and optical characteristics of liquid crystal. The LCD device has characteristics such as being thin, lightweight, using a low driving voltage, and low power consumption. The LCD device is widely used in various fields.

The LCD device includes an LCD panel displaying an image. The LCD panel does not generate light. Therefore, the LCD device can include a backlight assembly having a light source that provides light to the LCD panel.

A light emitting diode (LED) has been employed as a light source of the backlight assembly. However, since conventional LEDs are expensive, manufacturing costs of the backlight assembly have increased.

Also, since the LED corresponds to a point light source, a solution is needed for the LCD panel of the LCD device to have a uniform optical distribution. In addition, conventional LEDs having a predetermined volume increase the thickness of the LCD device.

SUMMARY OF THE INVENTION

Embodiments of the present invention provide a backlight assembly capable of uniformizing an optical distribution and reducing a thickness, and a display device having the backlight assembly.

A backlight assembly, according to an embodiment of the present invention, includes a light source unit, a light guiding plate and an optical changing pattern. The light source unit includes a light source generating light, a first lens portion enclosing the light source and a second lens portion positioned on the first lens portion. The second lens portion has a concave shape at an upper face. The light guiding plate includes an upper face and a lower face positioned opposite the upper face. The light guiding plate has a groove formed on the lower face to enclose at least a portion of the light source unit. The light guiding plate guides the light generated from the light source unit. The optical path changing pattern is formed on the upper face of the light guiding plate. The optical path changing pattern faces the light source unit.

For example, a side face of the first lens portion of the light source unit includes a curved portion. An outer side face of the second lens portion of the light source unit may have a truncated cone shape, and an inner side face of the second lens portion of the light source unit may have a cone shape.

In an exemplary embodiment, the groove may include a curved portion toward the upper face of the light guiding plate.

For example, the groove is defined by an inclined surface that is inclined to form an acute angle with respect to the lower face of the light guiding plate and a connection surface that extends from the inclined surface and is substantially in parallel with the lower face of the light guiding plate.

Alternatively, the groove may be defined by a first face that extends from the lower face of the light guiding plate, a second face that extends from the first face and is inclined to form an obtuse angle with respect to the lower face of the light guiding plate and a third face that extends from the second face and protrudes toward the light source unit. The second face may include a curved portion toward the upper face of the light guiding plate, and the third face may correspond to the concave shape of the second lens portion.

The optical path changing pattern may cover the light source unit. The backlight assembly may further include a reflective sheet disposed under the light guiding plate to reflect the light leaked from the light guiding plate, and a hole is formed through the reflective sheet corresponding to the light source unit.

A display device, according to an embodiment of the present invention, includes a display unit and a backlight assembly. The display unit displays an image by using light. The backlight assembly provides the light to the display unit. The backlight assembly includes a light source unit, a light guiding plate and an optical path changing pattern. The light source unit includes a light source generating light, a first lens portion enclosing the light source and a second lens portion positioned on the first lens portion. The second lens portion has a concave shape at an upper face. The light guiding plate includes an upper face and a lower face positioned opposite the upper face. The light guiding plate has a groove enclosing at least a portion of the light source unit. The light guiding plate guides the light generated from the light source unit. The optical path changing pattern is formed on the upper face of the light guiding plate. The optical path changing pattern faces the light source unit.

A light source unit is disposed in a groove that is formed on a lower face of a tight guiding plate, thereby uniformizing an optical distribution of a backlight assembly having the light guiding plate and reducing a size of the backlight assembly. Also, an optical path changing pattern is formed on a portion of an upper face of the light guiding plate corresponding to the light source unit, thereby further uniformizing the optical distribution.

BRIEF DESCRIPTION OF THE DRAWINGS

Exemplary embodiments of the present invention can be understood in more detail from the following descriptions taken in conjunction with the accompanying drawings, in FIG. 1 is an exploded perspective view illustrating a backlight assembly according to an exemplary embodiment of the present invention.

DESCRIPTION OF EXEMPLARY EMBODIMENTS

Figure 1:
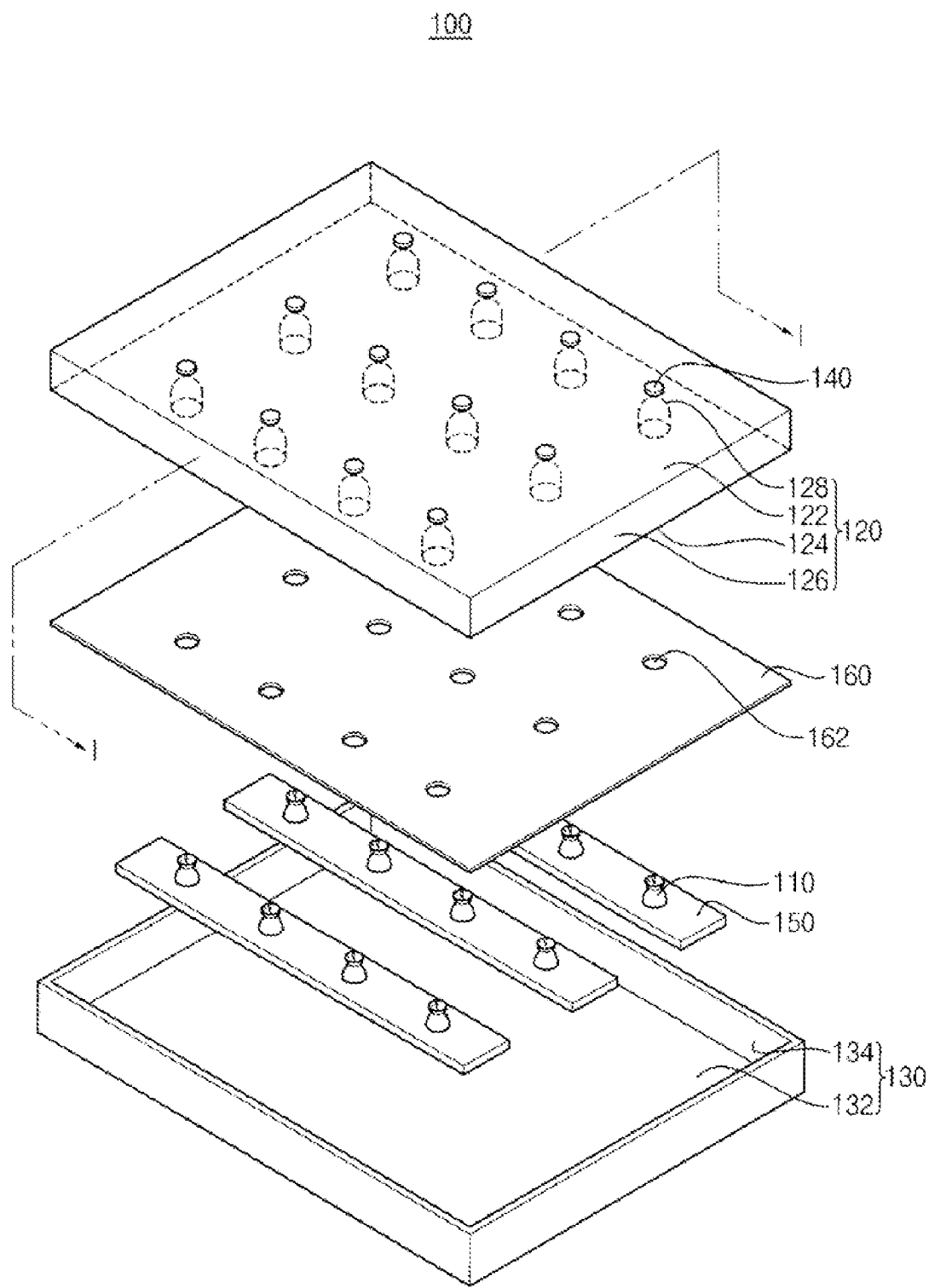

Exemplary embodiments of the present invention will be described more fully hereinafter with reference to the accompanying drawings. This invention may, however, be embodied in many different forms and should not be construed as limited to the embodiments set forth here n. It will be understood that when an element is referred to as being "on" or "onto" another element, it may be directly on the other element or intervening elements may also be present. FIG. 1 is an exploded perspective view illustrating a backlight assembly according to an exemplary embodiment of the present invention, FIG. 2 is a cross-sectional view taken along a line I-I' in FIG. 1.

Figure 2:
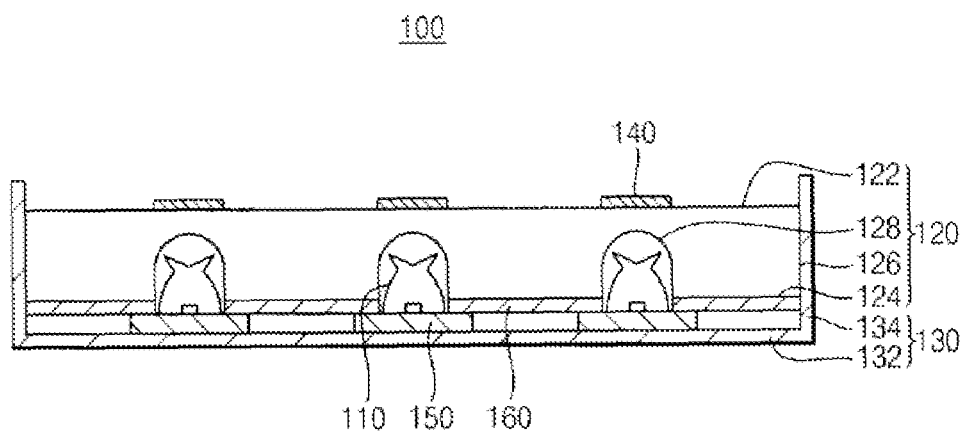
FIG. 2 is a cross-sectional view taken along a line I-I' in FIG. 1.

Referring to FIGS. 1 and 2, a backlight assembly 100 includes a plurality of light source units 1 10, a light guiding plate 120 and a receiving container 130.

The light source units 110 are arranged in a matrix shape, and each of the light source units 110 serves as a point light source.

In FIGS. 1 and 2, each of the light source units 110 has substantially the same structure and function.

Figure 3:
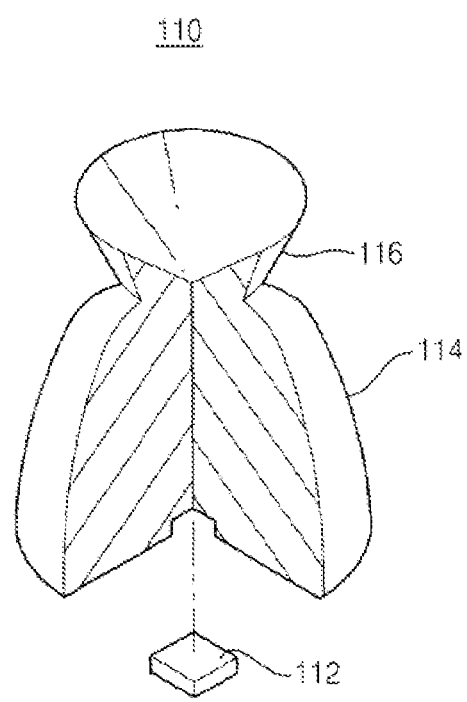
FIG. 3 is an exploded perspective view illustrating a light source unit illustrated in FIGS. 1 and 2.

FIG. 3 is an exploded perspective view illustrating a light source unit illustrated in FIGS. 1 and 2.

Referring to FIG. 3, the light source unit 110 includes a light source 112, a first lens portion 114 and a second lens portion 116.

The light source 112 generates light. The light source 112 includes, for example, a light emitting diode (LED). In an exemplary embodiment, the light source 112 includes an LED chip.

The first lens portion 114 encloses the light source 112, and changes an optical path of the light generated from the light source 112. A side face of the first lens portion 114 includes a curved portion. Thus, after the light generated from the light source 112 passes through the first lens portion 114, an optical path of the light may be changed.

The second lens portion 116 is positioned on the first lens portion 114 and has a concave shape at an upper face. Due to the concave shape, light that enters the second lens portion 116 may be totally reflected after the light is generated from the light source 112 and passes through the first lens portion 114. Thus, the second lens port ion 116 may change an optical path so that a portion of the light generated from the light source advances toward a side of the light source unit 110.

For example, the second lens portion 116 includes, as shown in FIG. 3, an outer side face and an inner side face having a cone shape. For example, the outer side face has a truncated cone shape. Here, the concave shape of the second lens portion 116 is defined by the inner side face.

Referring again to FIGS. 1 and 2, the light guiding plate 120 includes an upper face 122, a lower face 124 positioned opposite the upper face 122 and a side face 126 connecting the upper face 122 to the lower face 124. The light guiding plate 120 guides the light generated from the light source unit 110.

The light guiding plate 120 has a groove 128 enclosing at least a portion of the light source unit 110. As shown in FIGS. 1 and 2, the groove 128 is formed on the lower face 124. For example, the groove 128 includes a curved portion that is toward the upper face 122.

The receiving container 130 receives the light source unit 110 and the light guiding plate 120. The receiving container 130 includes a bottom plate 132 having, for example, a flat plate shape and a sidewall 134 extending from an edge portion of the bottom plate 132.

The backlight assembly 100 may further include an optical path changing pattern 140. The optical path changing pattern 140 is formed on the upper face 122 of the light guiding plate 120, and faces the light source unit 110. The optical path changing pattern 140 scatters the light that is generated from the light source unit 110 and arrives at the optical path changing pattern 140. In FIGS. 1 and 2, the optical path changing pattern 140 has, for example, a circular shape. In an exemplary embodiment, the optical path changing pattern 140 overlaps, for example, covers the light source unit 110.

The backlight assembly 100 may further include a circuit board 150 disposed under the light source unit 110. The circuit board 150 provides power to the light source unit 110. In FIGS. 1 and 2, the tight source 112 is disposed on the circuit board 150.

The backlight assembly 100 optionally includes a reflective sheet 160. The reflective sheet 160 is disposed under the light guiding plate 120 to reflect the light leaked from the light guiding plate 120. Holes 162 are formed through the reflective sheet 160 corresponding to the light source units 110. A light source unit 110 is inserted through the hole 162 of the reflective sheet 160 and is positioned in a groove 128 of the light guiding plate 120.

Figure 4:
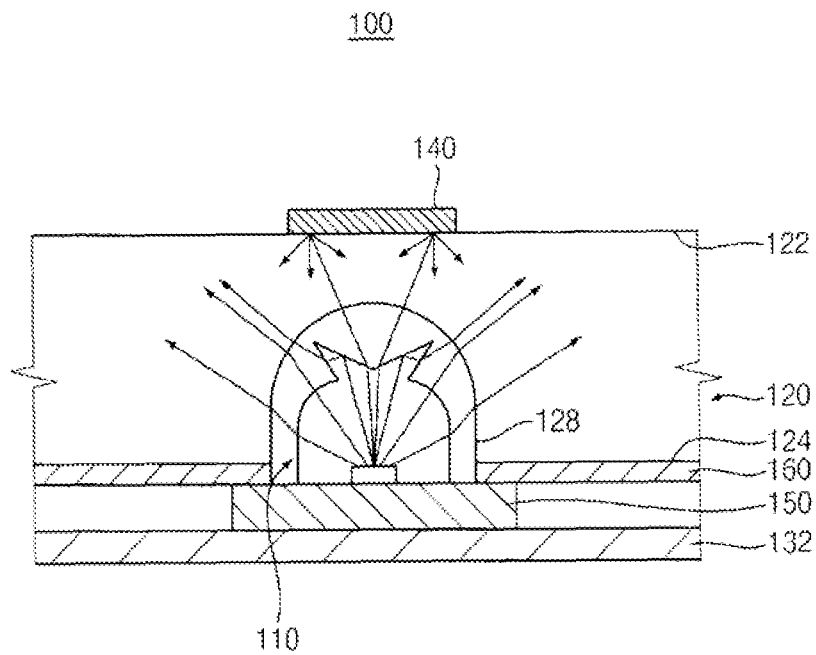
FIG. 4 is a partial cross-sectional view illustrating an optical path in a light guiding plate of the backlight assembly illustrated in FIGS. 1 and 2.

FIG. 4 is a partial cross-sectional view illustrating an optical path in a light guiding plate of the backlight assembly illustrated in FIGS. 1 and 2.

Referring to FIG. 4, the light that is generated from the light source 112 and passes through a side face of the first lens portion 114, is refracted to the lower face of the light guiding plate 120 due to curvature of the side face of the first lens portion 114 enclosing the light source 112. Thus, a portion of the tight generated from the light source 112 may advance toward a side face 126 of the tight guiding plate 120.

The light that enters the second lens portion 116, after the tight is generated from the light source 112 and passes through the first lens portion 114, may be totally reflected 290 due to the concave shape of the second lens portion 116. As shown in FIG. 4, when the second tens portion 116 includes an inner side face of a cone shape defining the concave shape, the light that enters the second lens portion 116 may be refracted to exit the second lens portion 116 or may be totally reflected in accordance with an incident angle to the inner side face.

Particularly, when the light is incident onto the inner side face having the cone shape at an angle greater than a critical angle the incident light is totally reflected. Thus, a portion of the light generated from the light source 112 may advance toward the side face 126 of the light guiding plate 120. When the light is incident onto the inner side face having a cone shape at an angle smaller than a critical angle, the incident light is refracted to exit the second lens portion 116. Thus, a portion of the light generated from the light source 112 may advance toward the upper face 122 of the light guiding plate 120.

The tight that arrives at the upper face 122 of the tight guiding plate 120 is scattered on the optical path changing pattern 140 that is formed on the upper face 122 of the light guiding plate 120.

When the backlight assembly 100 does not include the optical path changing pattern 140, most of the light that advances toward the upper face 122 of the light guiding plate 120 is incident onto the upper face 122 of the light guiding plate 120 at an angle smaller than a critical angle, and the tight exits the light guiding plate 120 through the upper face 122. Thus, the light is concentrated in a position over the light guiding plate 120 corresponding to the light source unit 110, so that luminance uniformity may be lowered.

However as shown in FIG, 4, when the backlight assembly 100 includes the optical path changing pattern 140, the light that advances toward the upper face 122 of the light guiding plate 120 is scattered by the optical path changing pattern 140. Thus, the light may be prevented from being concentrated in a position over the tight guiding plate 120 corresponding to the light source unit 110, so that luminance uniformity may be improved.

In FIG. 4, the optical path changing pattern 140 is formed on the upper face 122 of the light guiding plate 120. Alternatively, the upper face 122 of the light guiding plate 120 may be patterned unevenly to form the optical path changing pattern 140.

As described above, since the light source unit 110 is inserted into the groove 128 that is formed on the light guiding plate 120, the light generated from the light source unit 110 may advance toward the side face 126 of the light guiding plate 120 to thereby improve luminance uniformity, when compared with the case that the light source unit 110 is disposed under the light guiding plate 120. In addition, a size of the backlight assembly 100 having the light source unit 110 may be reduced.

As shown in FIGS. 1 and 2, the backlight assembly 100 includes a plurality of light source units 110. Alternatively, the backlight assembly 100 may include one light source unit 110.

Figure 5:
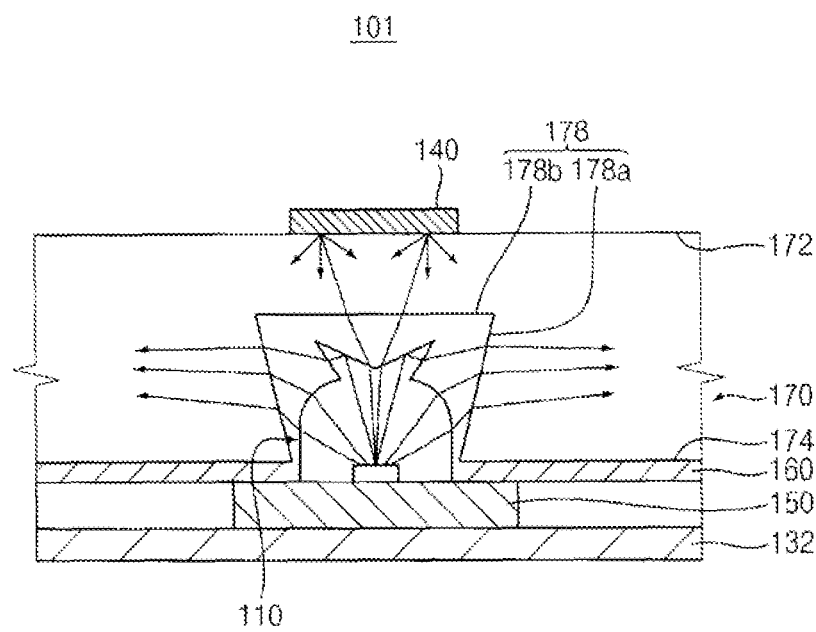
FIG. 5 is a partial cross-sectional view illustrating an optical path in a light guiding plate of a backlight assembly according to an exemplary embodiment of the present invention.

FIG. 5 is a partial cross-sectional view illustrating an optical path in a light guiding plate of a backlight assembly according to an exemplary embodiment of the present invention.

Referring to FIG. 5, a backlight assembly 101 according to an exemplary embodiment of the present invention includes a light source unit 110, a light guiding plate 170, a receiving container 130, an optical path changing pattern 140, a circuit board 150 and a reflective sheet 160.

The backlight assembly 101 is substantially the same as the backlight assembly 100 illustrated in FIGS. 1 and 2 except with respect to, for example, the light guiding plate 170.

The light guiding plate 170 includes an upper face 172, a lower face 174 positioned opposite the upper face 172 and a side face (not shown) connecting the upper face 172 to the lower face 174. The light guiding plate 170 guides the light generated from the light source unit 110.

The light guiding plate 170 has a groove 178 enclosing at least a portion of the light source unit 110. As shown in FIG. 5, the groove 178 is formed on the lower face 174, and is defined by an inclined surface 178a and a connection surface 178b.

The inclined surface 178a is inclined with respect to the lower face 174 of the light guiding plate 170. Particularly, the inclined surface 178a forms an acute angle with respect to the lower face 174 of the light guiding plate 170. The inclined surface 178a has, for example, a truncated cone shape.

The connection surface 178b extends from the inclined surface 178a, and is substantially in parallel with the lower face 174 of the light guiding plate 170. Alternatively, the connection surface 178b may include a curved portion that is toward the upper face 172 or the lower face 174 of the light guiding plate 170.

As shown in FIG. 5, when the inclined surface 178a forms an acute angle with respect to the lower face 174 of the light guiding plate 170, the light generated from the light source unit 110 is incident onto the inclined surface 178a at an increased incident angle. Thus, the light generated from the light source unit 110 may advance toward a side face of the light guiding plate 170 to thereby improve luminance uniformity.

Figure 6:
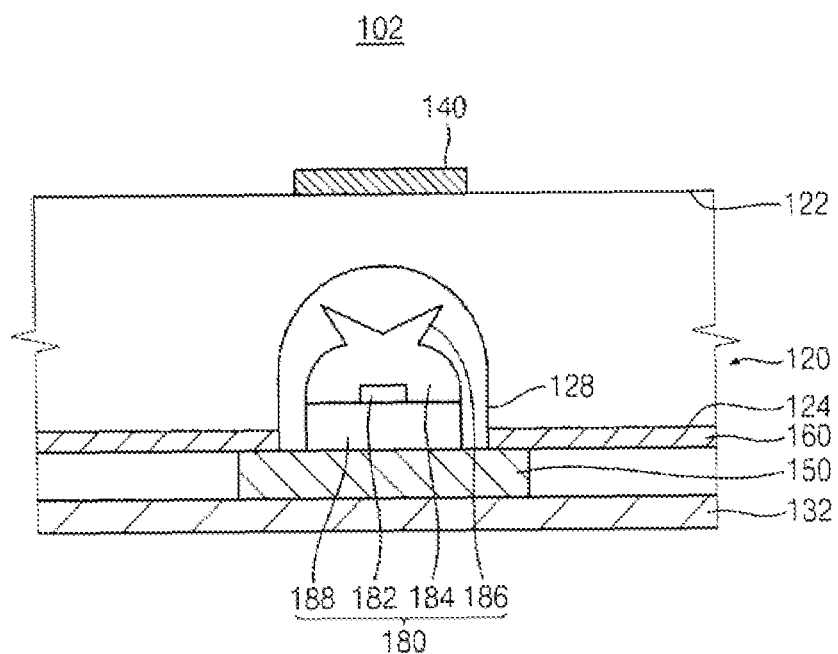
FIG. 6 is a partial cross-sectional view illustrating a backlight assembly according to an exemplary embodiment of the present invention.

FIG. 6 is a partial cross-sectional view illustrating a backlight assembly according to an exemplary embodiment of the present invention.

Referring to FIG. 6, a backlight assembly 102 according to an exemplary embodiment of the present invention includes a light source unit 180, a light guiding plate 120, a receiving container 130, an optical path changing pattern 140, a circuit board 150 and a reflective sheet 160.

The backlight assembly 102 is substantially the same as the backlight assembly 100 illustrated in FIGS. 1 and 2 except with respect to, for example, the light source unit 180.

The light source unit 180 includes a light source 182, a first lens portion 184, a second tens portion 186 and a stepped portion 188.

The light source unit 180 is substantially the same as the light source unit 110 illustrated in FIGS. 1 to 3 except with respect to for example, the stepped portion 188.

The stepped portion 188 separates the circuit board 150 and the light source 182 from each other by a predetermined distance. Thus, since the light source 182 of the light source unit 180 is more inserted further into the groove 128, the light generated from the light source unit 180 may easily advance toward a side face of the light guiding plate 120 to thereby improve luminance uniformity.

Figure 7A:
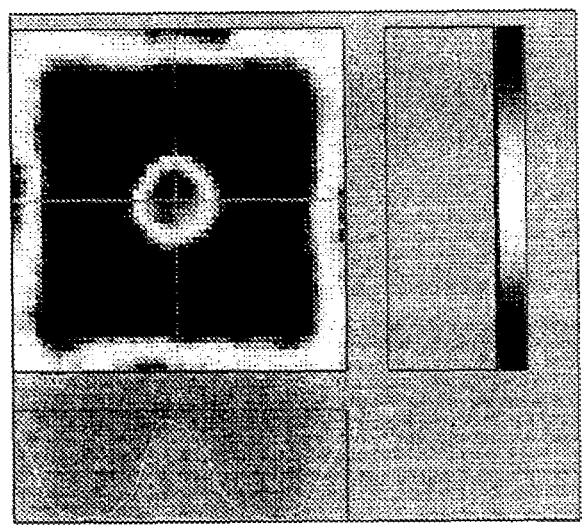
FIGS. 7A to 7C are graphs showing simulation results of optical distributions in accordance with a size of an optical path changing pattern of the backlight assembly illustrated in FIG. 6.
Figure 7B:
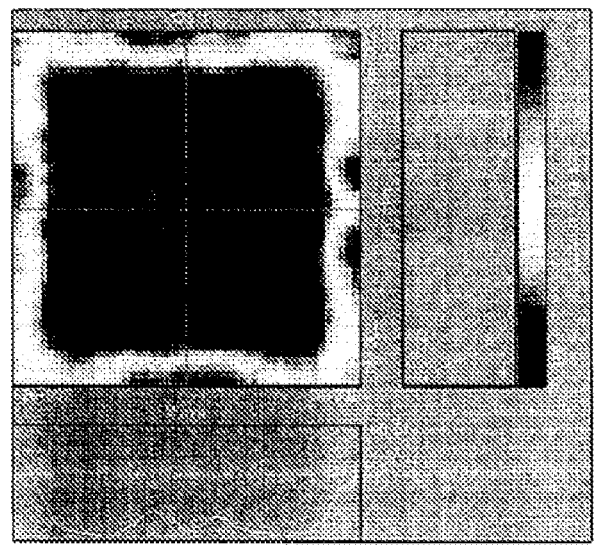
Figure 7C:
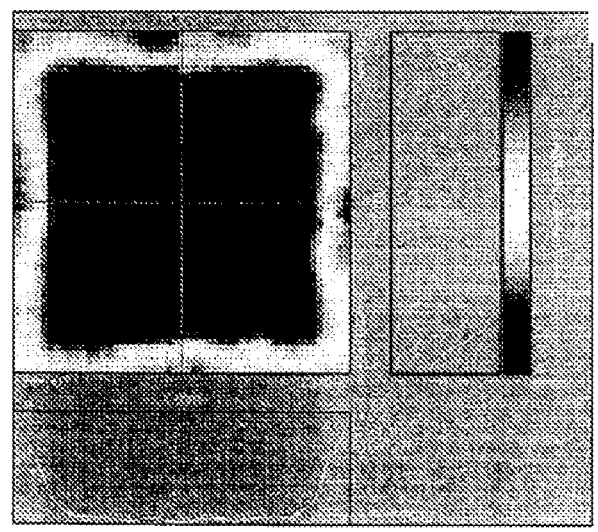

FIGS. 7A to 7C are graphs showing simulation results of optical distributions in accordance with a size of an optical path changing pattern of the backlight assembly illustrated in FIG. 6. The simulation was performed by using an "Advanced System Analysis Program (ASAP)" (manufactured by Breault Research Organization (BRO) Inc.).

In the present simulation, one light source unit 180 was used, and a diameter of the first lens portion 184 of the light source unit 180 was about 5.6 mm. FIG. 7A is a graph showing a simulation result of an optical distribution when a diameter of the optical path changing pattern 140 is about 20 mm. FIG. 78 is a graph showing a simulation result of an optical distribution when a diameter of the optical path changing pattern 140 is about 30 mm. FIG. 70 is a graph showing a simulation result of an optical distribution when a diameter of the optical path changing pattern 140 is about 40 mm.

Referring to FIG. 7A, when the optical path changing pattern 140 has a diameter of about 20 mm, most of the light that is generated from the light source unit 180 and advances toward the upper face 122 of the light guiding plate 120 may directly exit the light guiding plate 120. Thus, a relatively large amount of the light exits the light guiding plate 120 to a position over the light guiding plate 120 corresponding to the light source unit 180, so that the optical distribution is less uniform.

Referring to FIGS. 7B and 7C, when the diameter of the optical path changing pattern 140 is increased to about 30 mm or about 40 mm, most of the light that is generated from the light source unit 180 and advances toward the upper face 122 of the light guiding plate 120 does not directly exit the tight guiding plate 120 due to being shielded by the optical path changing pattern 140. Thus, an amount of the light that directly exits the tight guiding plate 120 to a position over the tight guiding plate 120 corresponding to the light source unit 180 is decreased from when the diameter of the optical path changing pattern is about 20 mm, so that the optical distribution becomes relatively more uniform.

Figure 8:
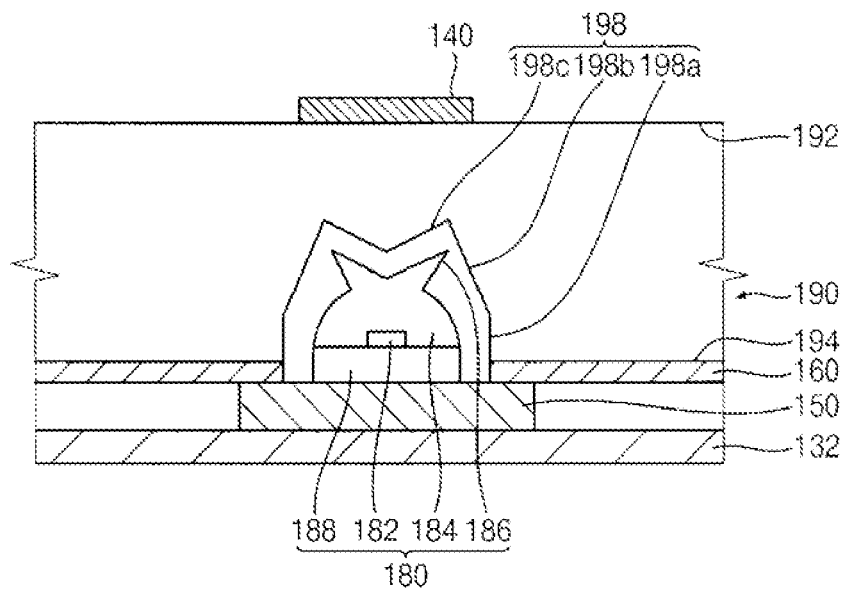
FIG. 8 is a partial cross-sectional view illustrating a backlight assembly according to an exemplary embodiment of the present invention.

FIG. 8 is a partial cross-sectional view illustrating a backlight assembly according to an exemplary embodiment of the present invention.

Referring to FIG. 8>a backlight assembly 103 according to an exemplary embodiment of the present invention includes a light source unit 180, a light guiding plate 190, a receiving container 130, an optical path changing pattern 140, a circuit board 150 and a reflective sheet 160.

The backlight assembly 103 is substantially the same as the backlight assembly 102 illustrated in FIG. 6 except with respect to, for example, the light guiding plate 190.

The light guiding plate 190 includes an upper face 192, a lower face 194 positioned opposite the upper face 192 and a side face (not shown) connecting the upper face 192 to the lower face 194. The light guiding plate 190 guides the light generated from the tight source unit 180.

The light guiding plate 190 has a groove 198 enclosing at least a portion of the light source unit 180. As shown in FIG. 8, the groove 198 is formed on the lower face 194, and is defined by a first face 198a, a second face 198b and a third face 198c.

The first face 198a extends from the lower face 194 of the light guiding plate 190. For example, the first face 198a is substantially perpendicular to the lower face 194 of the light guiding plate 190, and has a cylindrical shape.

The second face 198b extends from the first face 198a, and is inclined with respect to the lower face 194 of the light guiding plate 190. Particularly, the second face 198b forms an obtuse angle with respect to the lower face 194 of the light guiding plate 190. For example, the second face 198b has a truncated cone shape.

The third face 198c extends from the second face 198b toward the light source unit 180. For example, the third face 198c has a cone shape. The third face 198c corresponds to the concave shape of the second lens portion 186 of the light source unit 180.

Referring to FIG. 8, when the third face 198c corresponds to the concave shape of the second lens portion 186 of the light source unit 180, the light generated from the light source unit 180 is incident onto the third face 198c at an increased incident angle. As a result, most of the light that is generated from the light source unit 180 and is incident onto the third face 198c may be totally reflected at the third face 198c and then may advance toward a side face of the light guiding plate 190, thereby improving luminance uniformity.

Figure 9:
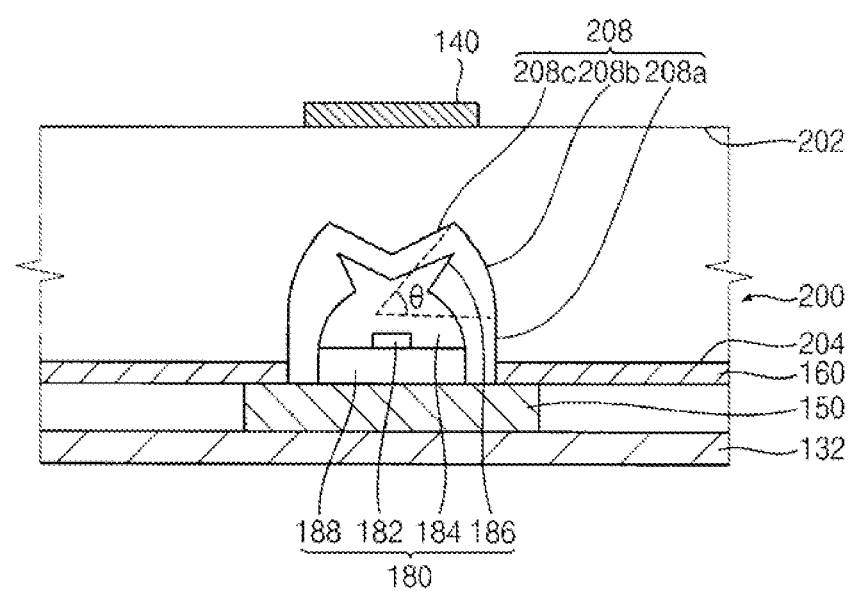
FIG. 9 is a partial cross-sectional view illustrating a backlight assembly according to an exemplary embodiment of the present invention.

FIG. 9 is a partial cross-sectional view illustrating a backlight assembly according to an exemplary embodiment of the present invention.

Referring to FIG. 9, a backlight assembly 104 according to an exemplary embodiment of the present invention includes a light source unit 180, a light guiding plate 200, a receiving container 130, an optical path changing pattern 140, a circuit board 150 and a reflective sheet 160.

The backlight assembly 104 is substantially the same as the backlight assembly 103 illustrated in FIG. 8 except with respect to, for example, the light guiding plate 200.

The light guiding plate 200 includes an upper face 202>a lower face 204 positioned opposite the upper face 202 and a side face (not shown) connecting the upper face 202 to the lower face 204. The light guiding plate 200 receives the light source unit 180. The light guiding plate 200 has a groove 208 defined by a first face 208a, a second face 208b and a third face 208c.

The light guiding plate 200 is substantially the same as the light guiding plate 190 illustrated in FIG. 8 except with respect to, for example, the second face 208b of the groove 208.

The second face 208b extends from the first face 208a, and is inclined with respect to the lower face 204 of the light guiding plate 200. Particularly, the second face 208b forms an obtuse angle with respect to the lower face 204 of the light guiding plate 200. For example, the second face 208b includes a curved portion that is toward the upper face 202 of the light guiding plate 200.

When the second face 208b corresponds to an arc of a sector, a curvature of the second face 208b is defined as a central angle θ of the sector as shown in FIG. 9, FIGS. 10A to 10C are graphs showing simulation results of optical distributions in accordance with a curvature of a second face of a groove formed on a light guiding plate illustrated in FIG. 9. The simulation was performed by using an "Advanced System Analysis Program (ASAP)" (manufactured by Breault Research Organization (BRO) Inc.).

Figure 10A:
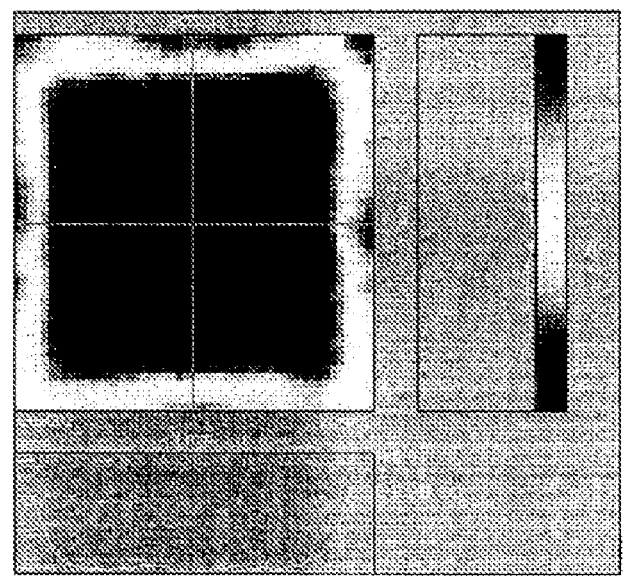
FIGS. 10A to 10C are graphs showing simulation results of optical distributions in accordance with a curvature of a second face of a groove formed on a light guiding plate illustrated in FIG. 9.
Figure 10B:
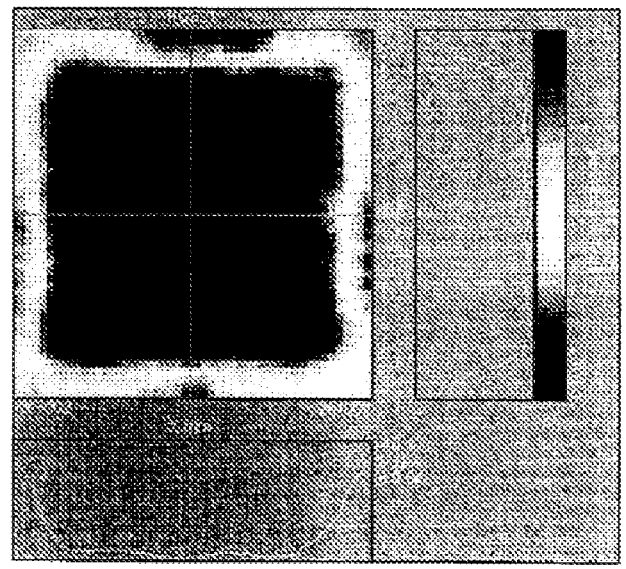
Figure 10C:
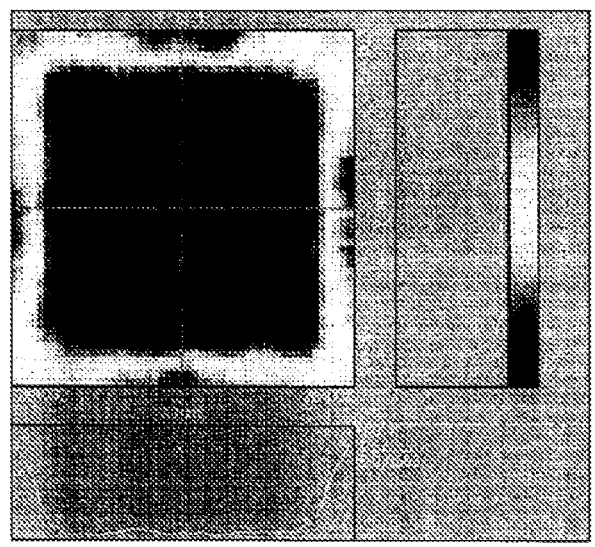

In the present simulation, one light source unit 180 was used, a diameter of the first lens portion 184 of the light source unit 180 was about 5.6 mm, and a diameter of the optical path changing pattern 140 was about 40 mm. FIG. 10A is a graph showing a simulation result of an optical distribution when a central angle θ corresponding to the curvature of the second face 208b of the groove 208 is about 10 degrees. FIG. 10B is a graph showing a simulation result of an optical distribution when a central angle θ corresponding to the curvature of the second face 208b of the groove 208 is about 30 degrees. FIG. 10C is a graph showing a simulation result of an optical distribution when a central angle θ corresponding to the curvature of the second face 208b of the groove 208 is about 60 degrees.

Referring to FIGS. 10A to 10C, the backlight assembly 104 has a more uniform optical distribution at the central angle θ of about 30 degrees or about 60 degrees than about 10 degrees. The backlight assembly 104 has similar optical distributions at the central angle θ of about 30 degrees and about 60 degrees.

Accordingly, a central angle θ corresponding to the curvature of the second face 208b of the groove 208 is, for example, in a range of about 30 degrees to about 60 degrees.

Figure 11A:
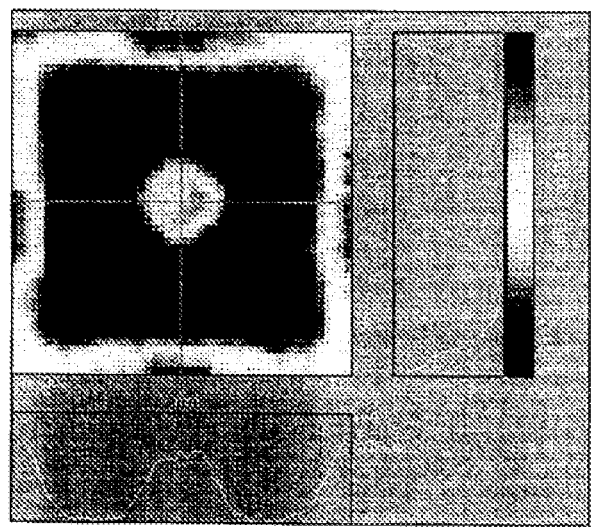
FIGS. 11A to 11C are graphs showing simulation results of optical distributions in accordance with a size of an optical path changing pattern of the backlight assembly illustrated in FIG. 9.
Figure 11B:
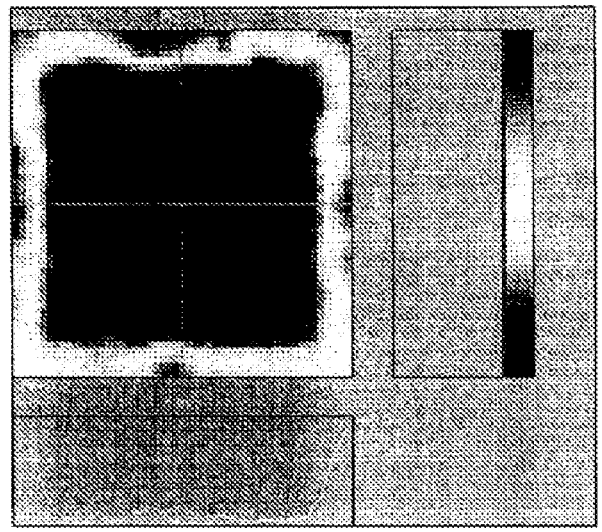
Figure 11C:
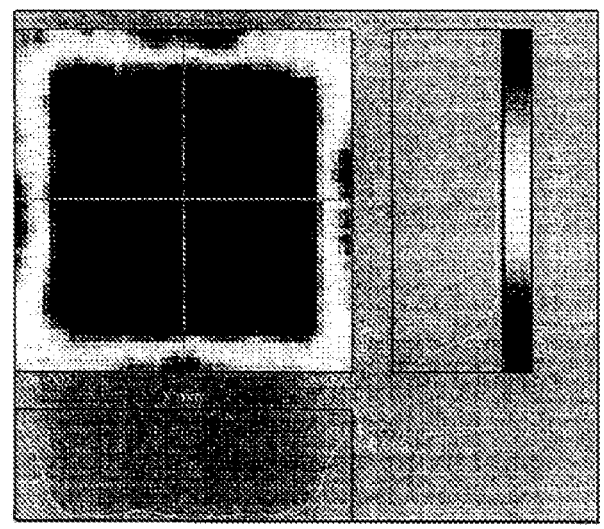

FIGS. 11A to 11C are graphs showing simulation results of optical distributions in accordance with a size of an optical path changing pattern of the backlight assembly illustrated in FIG. 9. The simulation was performed by using an "Advanced System Analysis Program (ASAP)">(manufactured by Breault Research Organization (BRO) Inc.).

In the present simulation, one light source unit 180 was used, a diameter of the first lens portion 184 of the light source unit 180 was about 5.6 mm, and a central angle θ corresponding to the curvature of the second face 208b of the groove 208 was about 60 degrees. FIG. 11A is a graph showing a simulation result of an optical distribution when a diameter of the optical path changing pattern 140 is about 20 mm. FIG. 11B is a graph showing a simulation result of an optical distribution when a diameter of the optical path changing pattern 140 is about 30 mm. FIG. 11C is a graph showing a simulation result of an optical distribution when a diameter of the optical path changing pattern 140 is about 40 mm.

Referring to FIGS. 11A to 11C similar to FIGS. 7A to 7C, when the diameter of the optical path changing pattern 140 is increased from about 20 mm to about 30 mm or about 40 mm, an amount of the light that directly exits the light guiding plate 200 to a position over the light guiding plate 200 corresponding to the light source unit 180 is relatively decreased, so that the optical distribution becomes relatively more uniform.

When comparing FIGS. 11A to 11C with FIGS. 7A to 7C, the light generated from the light source unit 180 is incident onto the third face 208c of the groove 208 at a greater incident angle than when the light guiding plate 120 has the groove 128 illustrated in FIG. 6. Thus, the optical distribution may be more uniform.

Figure 12:
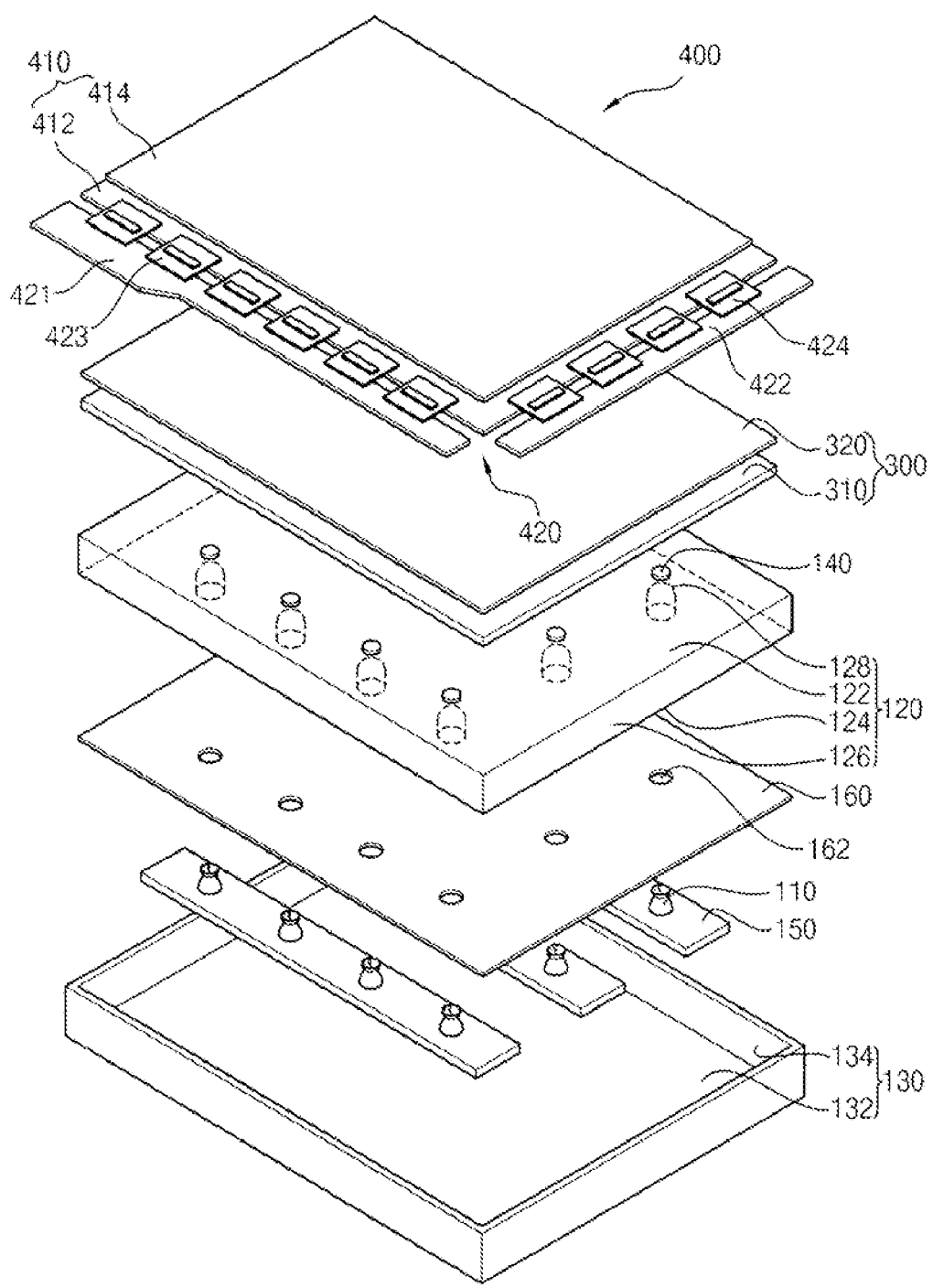
FIG. 12 is an exploded perspective view illustrating a liquid crystal display device according to an exemplary embodiment of the present invention.

FIG. 12 is an exploded perspective view illustrating a liquid crystal display device according to an exemplary embodiment of the present invention.

Referring to FIG. 12, a liquid crystal display (LCD) device 500 includes a backlight assembly 100, optical member 300 and a display unit 400.

The backlight assembly 100 is substantially the same as the backlight assembly 100 illustrated in FIGS. 1 and 2.

The optical member 300 is disposed over the light guiding plate 120. The optical member 300 includes, for example, a light-diffusing plate 310 that diffuses the light exiting the light guiding plate 120 to improve luminance uniformity of the light and at least one optical sheet 320 that enhances optical characteristics.

The display unit 400 includes an LCD panel 410 displaying an image using light provided from the backlight assembly 100 and a driver circuit part 420 driving the LCD panel 410.

The LCD panel 410 includes a first substrate 412, a second substrate 414 facing and coupled to the first substrate 412, and a liquid crystal layer (not shown) interposed between the first substrate 412 and the second substrate 414. For example, the first substrate 412 includes a thin film transistor (TFT) serving as a switching element and a pixel electrode (not shown) electrically connected to the TFT. For example, the second substrate 414 includes a color filter layer (not shown) having red, green and blue (RGB) pixels in a thin film form and a common electrode (not shown) formed on the color fitter layer.

The driver circuit part 420 includes a data printed circuit board 421 providing a data driving signal to the LCD panel 410, a gate printed circuit board 422 providing a gate driving signal to the LCD panel 410, a data driving circuit film 423 electrically connecting the data printed circuit board 421 to the LCD panel 410 and a gate driving circuit film 424 electrically connecting the gate printed circuit board 422 to the LCD panel 410.

As shown in FIG. 12, the LCD device 500 employs the backlight assembly 100 illustrated in FIGS. 1 and 2. Alternatively, the LCD device 500 may employ one of the backlight assemblies 101, 102; 103 and 104 illustrated in FIGS. 5, 6, 8 and 9, respectively.

According to the embodiments of the present invention, a light source unit is disposed in a groove that is formed on a lower face of a light guiding plate, thereby uniformizing an optical distribution of a backlight assembly having the light guiding plate and reducing a size of the backlight assembly.

Also, an optical path changing pattern is formed on a portion of an upper face of the light guiding plate corresponding to the light source unit, thereby further uniformizing the optical distribution.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A backlight assembly comprising:
    a light source unit comprising;
        a light source generating light;
        a first lens portion enclosing the light source; and
        a second lens portion disposed on the first lens portion, the second lens portion having a concave shape;
    a light guiding plate comprising an upper face and a lower face positioned opposite the upper face, the light guiding plate having a groove formed on the lower face to enclose at least a portion of the light source unit; and
    an optical path changing pattern formed on the upper face of the light guiding plate, the optical path changing pattern facing the light source unit.

2. The backlight assembly of claim 1, wherein a side face of the first lens portion of the light source unit comprises a curved portion.

3. The backlight assembly of claim 1, wherein an outer face of the second lens portion of the light source unit has a truncated cone shape, and an inner face of the second lens portion of the light source unit has a cone shape.

4. The backlight assembly of claim 1, wherein the groove comprises a curved portion toward the upper face of the light guiding plate.

5. The backlight assembly of claim 1 wherein the groove is defined by:
    an inclined surface forming an acute angle with respect to the tower face of the light guiding plate; and
    a connection surface that extends from the inclined surface and is substantially parallel to the lower face of the light guiding plate.

6. The backlight assembly of claim 1, wherein the groove is defined by:
    a first face that extends from the lower face of the light guiding plate;

a second face that extends from the first face and is inclined to form an obtuse angle with respect to the lower face of the light guiding plate; and a third face that extends from the second face toward the light source unit.

7. The backlight assembly of claim 6, wherein the second face comprises a curved portion toward the upper face of the light guiding plate.

8. The backlight assembly of claim 6, wherein the third face corresponds to the concave shape of the second lens portion.

9. The backlight assembly of claim 1, wherein the optical path changing pattern covers the light source unit.

10. The backlight assembly of claim 1, further comprising a reflective sheet disposed under the tight guiding plate, wherein a hole is formed through the reflective sheet corresponding to the tight source unit.

11. A display device comprising:

a display unit displaying an image by using light, and a backlight assembly providing the light to the display unit, the backlight assembly comprising:

a light source unit comprising a light source generating the light, a first lens portion enclosing the light source and a second lens portion positioned on the first lens portion, the second lens portion having a concave shape;

a tight guiding plate comprising an upper face and a lower face positioned opposite the upper face, the light guiding plate having a groove enclosing at least a portion of the light source unit; and an optical path changing pattern formed on the upper face of the light guiding plate, the optical path changing pattern facing the light source unit.

12. The display device of claim 11, wherein the groove is formed on the tower face of the tight guiding plate.

13. The display device of claim 12, wherein the groove is defined by:

a first face that extends from the lower face of the light guiding plate;

a second face that extends from the first face and is inclined to form an obtuse angle with respect to the tower face of the light guiding plate, the second face comprising a curved portion toward the upper face of the tight guiding plate; and a third face that extends from the second face toward the light source unit, the third face corresponding to the concave shape of the second lens portion.

* * * * *